United States Patent
Redwine (10) Patent No.: US 7,385,840 B2
(45) Date of Patent: Jun. 10, 2008

(54) SRAM CELL WITH INDEPENDENT STATIC NOISE MARGIN, TRIP VOLTAGE, AND READ CURRENT OPTIMIZATION

(75) Inventor: Donald J. Redwine, Canton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 11/191,348

(22) Filed: Jul. 28, 2005

(65) Prior Publication Data

US 2007/0025140 A1   Feb. 1, 2007

(51) Int. Cl.
*G11C 11/00* (2006.01)
(52) U.S. Cl. .................. 365/154; 365/156; 365/189.05
(58) Field of Classification Search ................ 365/154, 365/156, 189.05, 230.05
See application file for complete search history.

(56) References Cited

U.S. PATENT DOCUMENTS

| | | | |
|---|---|---|---|
| 5,243,555 A * | 9/1993 | Youn et al. .................. 365/154 |
| 5,353,251 A | 10/1994 | Uratani et al. | |
| 5,469,380 A | 11/1995 | Iio | |
| 5,475,638 A | 12/1995 | Anami et al. | |
| 5,477,489 A * | 12/1995 | Wiedmann .............. 365/189.04 |
| 5,828,597 A | 10/1998 | Madan | |
| 5,831,897 A | 11/1998 | Hodges | |
| 6,091,626 A | 7/2000 | Madan | |
| 6,717,841 B2 * | 4/2004 | Tsukikawa .................. 365/154 |
| 6,831,871 B2 | 12/2004 | Khellah et al. | |

OTHER PUBLICATIONS

U.S. Appl. No. 11/191,741, filed Jul. 28, 2005, Deng et al.
U.S. Appl. No. 11/202,141, filed Aug. 11, 2005, Houston.

* cited by examiner

*Primary Examiner*—David Lam
(74) *Attorney, Agent, or Firm*—Jacqueline J. Garner; W. James Brady, III; Frederick J. Telecky, Jr.

(57) ABSTRACT

An SRAM memory cell structure utilizing a read driver transistor and a column select write transistor, and a method of operating the same. The SRAM memory cell comprises first and second cross-coupled inverters, having a first and second latch nodes, respectively. The cell further comprises a first write pass transistor connected between the first latch node of the first inverter and a first pass node, and a first wordline pass transistor connected between the first pass node and a first bitline. The cell also includes a first read driver connected between the first pass node and a source potential, and a control terminal of the first read driver connected to the second latch node of the second inverter.

20 Claims, 9 Drawing Sheets

SRAM CELL WITH INDEPENDENT STATIC NOISE MARGIN, TRIP VOLTAGE, AND READ CURRENT OPTIMIZATION

FIELD OF INVENTION

The present invention relates generally to semiconductor memory devices, and more particularly to an improved SRAM cell and method that avoids some of the static noise margin and trip voltage problems of conventional SRAM cells by the addition of a read driver for isolating the read current from the latch nodes of the cell during read operations and a column write transistor for single cell selection during write operations in the manufacture of semiconductor products.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations.

The basic CMOS SRAM cell generally includes two n-type or n-channel (nMOS) pull-down or drive transistors and two p-type (pMOS) pull-up or load transistors in a cross-coupled inverter configuration, with two additional nMOS select or pass-gate transistors added to make up a six-transistor cell (a 6 T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

As transistor scaling trends continue, however, it becomes increasingly difficult to design an SRAM cell that has both adequate static noise margin (SNM) and adequate trip voltage (Vtrip), because of their interdependency in cell design. For example, if the pass gate is too strong relative to the drive transistor, SNM is degraded. If the pass gate is too weak relative to the drive transistor, Vtrip is degraded. Also, if the load is too weak relative to the drive transistor, SNM is degraded. With technology scaling to the 45 nm node and beyond, it may no longer be possible to achieve a balance in the relative strengths of the pass gate, drive, and load transistors over the desired range of temperature and bias conditions as well as process variations. Thus, the current balance in these design values often involves a trade-off that may translate to a higher incidence of data upsets and/or slower access times.

Accordingly, there is a need for an improved SRAM cell that allows independent optimization of the static noise margin, trip voltage, and read current of SRAM cells, while minimizing data upsets and power dissipation in the fabrication of SRAM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to an SRAM memory cell structure (e.g., a 7 T single ended and a 10 T differential SRAM memory cell) utilizing a read driver transistor for removing or isolating the read current from the latch nodes of the cell during read operations and a column select write transistor for selection of a single cell during write operations. The SRAM memory cell structure of the present invention allows independent optimization of the static noise margin, trip voltage, and read current, thereby avoiding some of the static noise margin and trip voltage problems of conventional SRAM cells (e.g., a conventional 6 T differential cell). The structures described herein are applicable to silicon wafer fabrication and other such fabrication processes in the manufacture of semiconductor memory devices.

In one aspect of the invention, the SRAM cell comprises a differential SRAM cell, comprising first and second cross-coupled inverters, the first inverter having a first latch node and the second inverter having a second latch node. This inverter arrangement forms a latch used as the basic data storage cell, which includes two complementary or differential latch nodes. The SRAM cell of the present invention further comprises a pair of pass-gate transistors at each of the first and second latch nodes of the cell, wherein the pair of pass-gate transistors are series connected via a pass node, between a latch node and a respective first and second bitline. First and second wordline (WL) pass transistors of the pass-gate pairs are connected to the wordline for row (Y) access to the cell during read or write operations. First and second column select write (CW) or write pass transistors of the pass-gate pairs are connected to a column (x) decoder for access to the cell during write operations. The SRAM cell further comprises first and second read drivers on respective sides of the data cell, each driver connected between the respective pass node and a source potential. A control terminal of each read driver is connected to the opposite latch node of the cell.

In another aspect of the invention, the SRAM cell comprises a single-ended SRAM cell, comprising first and second cross-coupled inverters, the first inverter having a first latch node and the second inverter having a second latch node. The SRAM cell of the present invention further comprises a pair of pass-gate transistors at the second latch node of the cell, wherein the pair of pass-gate transistors is series connected via a pass node, between the second latch node and a bitline. A wordline (WL) pass transistor of the pass-gate pair is connected to the wordline for row (Y) access to the cell during read or write operations. A column write (CW) pass transistor of the pass-gate pair is connected to a column (x) decoder for access to the cell during write operations. The SRAM cell further comprises a read driver connected between the pass node and a source potential. A control terminal of the read driver is connected to the first latch node of the cell.

In accordance with still another aspect of the invention, the first and second inverters of the SRAM cell comprise a pull-up transistor and a pull-down transistor.

During the read operation of a conventional 6 T SRAM cell, a read current is passed through an latch node of the selected data storage cell. The read current produces a voltage drop (Vdrop) across the associated pull-down transistor of the cell. This voltage drop requires the pull-down transistors to have a sufficiently high enough threshold voltage (Vt) to remain in the off-state during a read operation. As a result, the effective static noise margin (SNM) which remains (between the Vt and the Vdrop) is reduced and the data state of the selected cell may be more unstable.

Accordingly, a goal of the present invention is to provide a read current, which is indicative of the data state of the cell, yet removed from loading the data nodes or latch nodes of the cell. In accordance with the present invention, this goal is accomplished by adding a read driver (e.g., a transistor, or another such drive circuit) outboard from the data cell that passes the read current. The control terminal (e.g., gate) of the read driver is connected to the opposite differential latch node of the cell. For example, the gate of a read driver transistor may be connected to the same node as the gate of the associated pull-down transistor of the SRAM cell.

Further, during a write operation of a conventional 6 T SRAM cell, the wordline is asserted to all the cells associated with the selected wordline, including those cells that are unselected by the associated bitlines or columns of cells. In particular, these unselected data bits reside along the selected wordline, but are in the other unselected columns of the array. As the selected cell or cells are written into, the data in the unselected cells along the selected wordline may be upset, and in addition may consume unnecessary supply power charging the unselected cells. Accordingly, a goal of the present invention is to permit access to one or more selected cells along a wordline, by providing a column select write (CW) pass transistor for use during a write operation, particularly if access to the other cells along that wordline is unnecessary.

In accordance with another aspect of the invention, the first and second inverters of the SRAM cell each comprise a p-channel pull-up transistor and an n-channel pull-down transistor.

In still another aspect of the present invention, the first and second write pass transistors, the first and second wordline pass transistors, and the first and second read drivers are n-channel devices.

In yet another aspect, the first and second wordline pass transistors have about 0.75 times or less of the width of the read driver.

In another aspect of the invention, the cell is used for low voltage or low power application having a supply voltage level of about Vt +0.2 volts or less to about 3 or 4 times the Vt or less, wherein the Vt is the threshold voltage of a transistor within the first and second inverters. For example, the Vt of the cell may be about 0.4 volts or less.

A method of operating (e.g., reading or writing) an SRAM cell (e.g., a 7 T single ended and a 10 T differential SRAM memory cell) is also disclosed utilizing the SRAM cell of the present invention as described above. In one implementation, the method of operating the SRAM cell comprises activating the first and second wordline pass transistors by asserting a wordline signal WL associated with a plurality of cells of a row of the array for a read operation. The method also includes deactivating the first and second write pass transistors by deasserting a column write signal CW associated with a plurality of cells of a column of the array for a read operation. The method further comprises activating the first and second bitlines by asserting a bitline selection signal associated with one of the plurality of cells of a column of the array for the read operation such that the one of the plurality of cells of the array is activated, wherein a read current conducts through one of the respective first and second read drivers.

In addition, the method further includes, activating the write pass transistor(s) by asserting a column write signal associated with a plurality of cells of a column of the array during the write operation such that one of the plurality of cells of the array is activated.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention provides an SRAM memory cell structure (e.g., a 7 T single ended and a 10 T differential SRAM memory cell) utilizing a read driver transistor for removing or isolating the read current from the latch nodes (data nodes) of the data cell during read operations, and a column write transistor for selection of cell columns or a single cell during write operations. Because the read current is isolated from the data storage cell of the present invention, the static noise margin (SNM), trip voltage (Vtrip), and read current (Iread) may be independently optimized, thereby avoiding some of the static noise margin and trip voltage compromises and problems of conventional SRAM cells (e.g., a conventional 6 T differential cell).

As indicated previously, feature scaling trends continue down to around 45 nm areas or less, it may no longer be possible to achieve a balance in the relative strengths of the pass gate, drive, and load transistors over the desired range of temperature and bias conditions as well as process variations.

The inventors of the present invention have realized that the read current produces a voltage drop (Vdrop) across the associated pull-down transistor and latch node of the conventional cell, thereby raising the voltage of the respective latch node. This voltage drop requires the pull-down transistors to have a sufficiently high enough threshold voltage (Vt) to remain in the current data state during a read operation. As a result, the effective static noise margin (SNM) which remains (between the Vt and the Vdrop) is reduced and the data state of the selected cell may be more unstable. Accordingly, the inventors realized that the stability of the cell may be increased by removing or isolating the read current from the data cell using a read driver (e.g., a transistor, or another such drive circuit). The read driver of the present invention responds to the data state of the cell, but does not reflect the read current induced voltage drop back to the opposite latch node. As a result, the interdependence between the SNM and the trip voltage is removed from the data cell.

Further, the present invention avoids accessing and upsetting the unselected cells along a wordline, by providing a column select write (CW) pass transistor for use during a write operation, resulting in a true cross-point selected memory cell. In addition, this arrangement may be useful to limit power dissipation in the array to the cell or cells that are accessed.

The inventors have also realized that the sizes of the transistors of the cell and pass gates may then be optimized. For example, to decrease the access time, the read current may be increased by increasing the size of the wordline pass gate.

Exemplary implementations are hereinafter illustrated and described in the context of fabricating SRAM cell structures to remove the interdependence between the SNM and the Vtrip of the conventional 6 T SRAM cell in order to improve the optimization of a cell, and to avoid read and write data upsets, wherein the structures illustrated are not necessarily drawn to scale. It will be appreciated that the invention may be employed in the fabrication of SRAM memory devices, silicon wafer fabrication and other such fabrication processes in the manufacture of semiconductor memory devices, and other such processes apart from the exemplary memory structures described and illustrated herein. These and other benefits will become more apparent as the following figures are described infra.

Figure 1A:
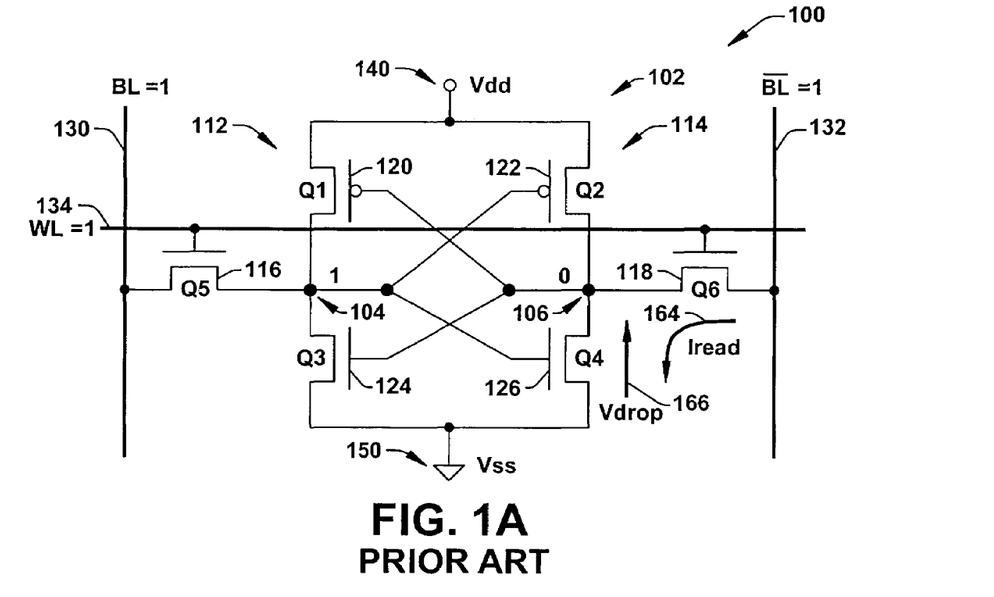
FIG. 1A is a schematic diagram of a conventional 6 T static random access memory (SRAM) cell.
Figure 1B:
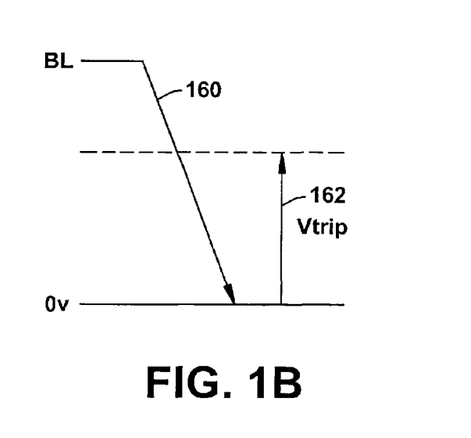
FIG. 1B is a simplified plot that may occur, of a bitline voltage, as applied to BL 130 being pulled below a trip voltage of the SRAM memory cell of FIG. 1A as a result of a write operation.
Figure 1C:
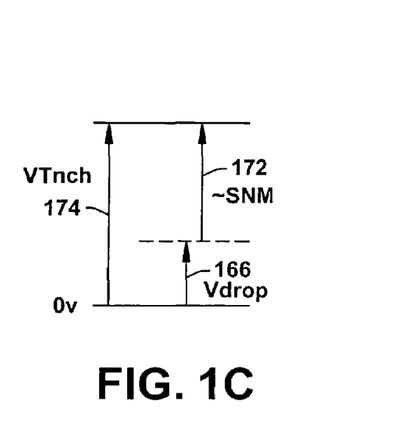
FIG. 1C is a simplified diagram of the relative voltage relationship between the voltage drop across a pull-down transistor during a read operation, the static noise margin, and the threshold voltage of the SRAM memory cell of FIG. 1A.

Beginning at FIGS. 1A-1C a conventional 6 T SRAM cell 100 is illustrated and several problems arising from read operations are presented.

FIG. 1A, for example, illustrates a schematic diagram for the conventional differential 6 T static random access memory (SRAM) cell 100. As illustrated, the SRAM cell 100 comprises a data storage cell or latch 102, generally including a pair of cross-coupled inverters, for example, inverter 112, and inverter 114, the latch 102 operable to store a data bit state. As illustrated in FIG. 1A, the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bitlines BL 130, BL-bar 132, when enabled by wordline 134.

Respective inverters 112, 114 comprise a p-type MOS (PMOS) pull-up or load transistor Q1 120, Q2 122 and an n-type (nMOS) pull-down transistor Q3 124, Q4 126. Pass transistors Q5 116, Q6 118 are n-channel as well, which generally supply higher conductance than p-channel transistors. Pass transistors 116, 118 are enabled by wordline 134 and accessed by bitlines 130, 132 to set or reset the SRAM latch 100. FIG. 1A further illustrates that inverters 112, 114 of the SRAM memory cell 100 are connected together to a Vdd drain power supply line 140 and a Vss source power supply line 150.

The differential 6 T SRAM cell comprises six transistors and is termed a 6 T full CMOS SRAM cell. When the channels of all the transistors are formed in the single crystal silicon substrate, it is called a single crystalline bulk CMOS 6 T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (120, 122) and nMOS (124, 126) transistors are load balanced and matched for the two inverters (112, 114). However, as dimensions are reduced to scale down devices, it becomes increasingly difficult to achieve a balance in the relative strengths of the pass gate, drive, and load transistors over the desired range of temperature, bias conditions, and process variations, as well achieving matched transistor characteristics. As a result, SRAM cells formed as such can be adversely affected by varying operating characteristics and may be unstable and may not retain the desired bit state, particularly during read operations.

FIG. 1B, for example, illustrates a simplified plot of a bitline (BL) voltage 160 of the SRAM cell 100 of FIG. 1A, wherein the BL voltage 160 may be pulled below the trip voltage (Vtrip) 162 and discharged to ground (Vss) as a result of a write operation. In other words, bitline voltage 160 further corresponds to the voltage that is on the high-side data stored in cell 100. In the present example, this would be the voltage at data node 104, during a write operation.

During the read operation, bitlines 130 and 132 are precharged to a high or "1" state, as shown in FIG. 1A. A wordline WL 134 is selected to activate pass transistors Q5 116 and Q6 118 into conduction. As a high state at latch node 104 is on the gate of Q4 126, and a low state at latch node 106 is on the gate of Q3 124, only Q4 126 on the "low side" conducts a read current 164. Read current Iread 164, conducts from the bitline-bar 132 through Q6 118, latch node 106, and Q4 126 to Vss 150. The read current 164 through Q6 and Q4 briefly creates a voltage drop Vdrop 166 across Q4 126, until the voltage on bitline-bar 132 is discharged to Vss 150 (e.g., ground) as shown in FIG. 1B. If sufficient voltage drop 166 is created by read current 164 to raise latch node 106 to the threshold voltage VTnch 174 of Q3 124, then Q3 may begin conducting and the data state of latch 102 may be upset.

FIG. 1C illustrates this relative relationship between the voltage drop Vdrop 166 across pull-down transistor Q4 126 during a read operation, the static noise margin SNM 172, and the threshold voltage VTnch 174 of the n-channel pull-down transistors Q3 124, and Q4 126 of SRAM memory cell 100 of FIG. 1A. The SNM reflects the statistical data loss due to read upsets. For example, if SNM is too low, some bits of an array of cells will start to fail in a Gaussian distribution. Thus during a read operation, the greater the voltage drop Vdrop 166 across the pull-down transistor, the smaller will be the remaining static noise margin SNM 172 within the available threshold voltage VTnch 174. Therefore, it is desirable to lower the voltage drop Vdrop 166, or better still to avoid its affect on the latch nodes 104 and 106 in order to maximize the SNM and optimize the switching characteristics of the latch 102.

Figure 2A:
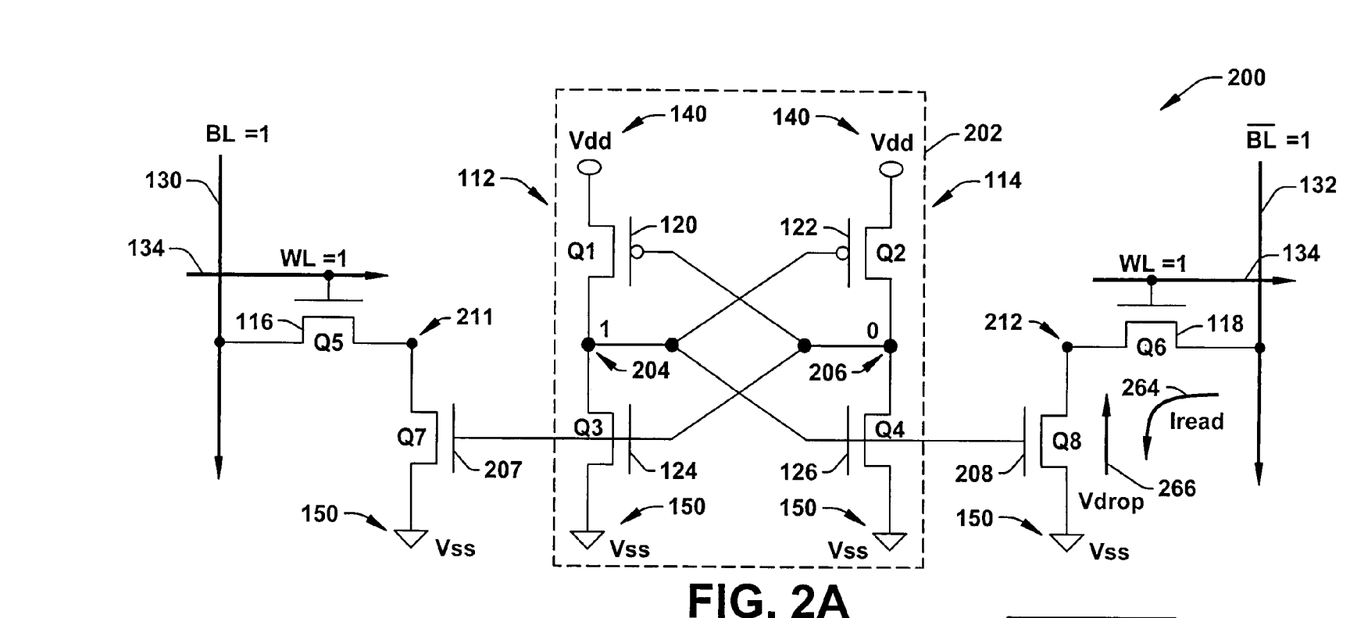
FIG. 2A is a schematic diagram of a conceptual modification to the 6 T SRAM cell of FIG. 1A using a read driver to remove the read current from the data nodes of the cell according to one or more aspects of the present invention.

FIG. 2A illustrates an exemplary conceptual cell 200 modified from that of the conventional 6 T SRAM cell 100 of FIG. 1A, using a read driver to remove the read current from latch nodes 204 and 206 of the cell according to one or more aspects of the present invention. Cell 200 comprises first and second read drivers Q7 207 and Q8 208 connected between first and second pass nodes 211 and 212 of the wordline pass transistors Q5 116 and Q6 118, respectively, and Vss 150. The first and second read drivers Q7 207 and Q8 208 also have gates connected to the gates of the n-channel pull-down transistors Q3 124 and Q4 126, respectively, at the latch nodes 204 and 206, respectively. Clearly, in this arrangement, Q8 208 will reflect the conduction of Q4 126, and thus produce a mirrored read current as described below.

During a read operation of cell 200, bitlines 130 and 132 are again precharged to a high or "1" state, as shown in FIG. 2A. A wordline WL 134 is selected to activate pass transistors Q5 116 and Q6 118 into conduction. For example, with the prior data states as shown in FIG. 2A, an exemplary read current Iread 264, conducts from the bitline-bar 132 through wordline pass transistor Q6 118, pass node 212, and read driver Q8 208 to Vss 150.

Again, the read current Iread 264 through Q6 and Q8 briefly creates a voltage drop Vdrop 266 across Q8 208, until the charge on bitline-bar 132 is discharged to Vss 150. However, with this configuration, the read current Iread 264 beneficially bypasses Q4 126 and the latch node 206, thereby avoiding a voltage drop across Q4 126 and a possible data upset therefrom. Although a voltage drop Vdrop 266 is still produced across Q8 208, the voltage at the pass node 212 is not coupled to the latch node 206 of the cell as in the conventional 6 T SRAM configuration. The 8 T cell of FIG. 2A illustrates the basic read operation concept of the 10 T SRAM cell of the present invention, but does not constitute a practical cell as it can not write to the bit (latch).

Figure 2B:
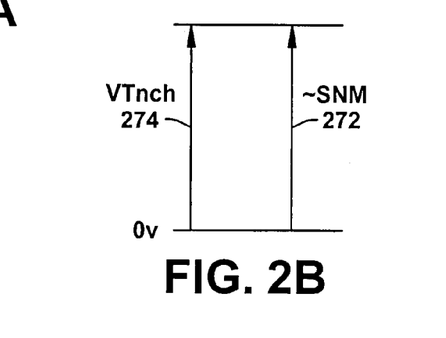
FIG. 2B is a simplified diagram of the relative voltage relationship between the static noise margin and the threshold voltage of the SRAM memory cell of FIG. 2A during a read operation.

FIG. 2B illustrates the relative voltage relationship between the static noise margin SNM 272 and the threshold voltage VTnch 274 of the SRAM memory cell of FIG. 2A during a read operation. As the read current Iread 264 bypasses the pull-down transistor Q4 126, there is no appreciable change in the static voltage drop across Q4 126. Therefore the SNM 272 is not reduced by Vdrop 266 as in the conventional 6 T SRAM cell 100 of FIG. 1A, thereby stabilizing the data state of the cell 200.

Figures 3A, 3B, 3C:
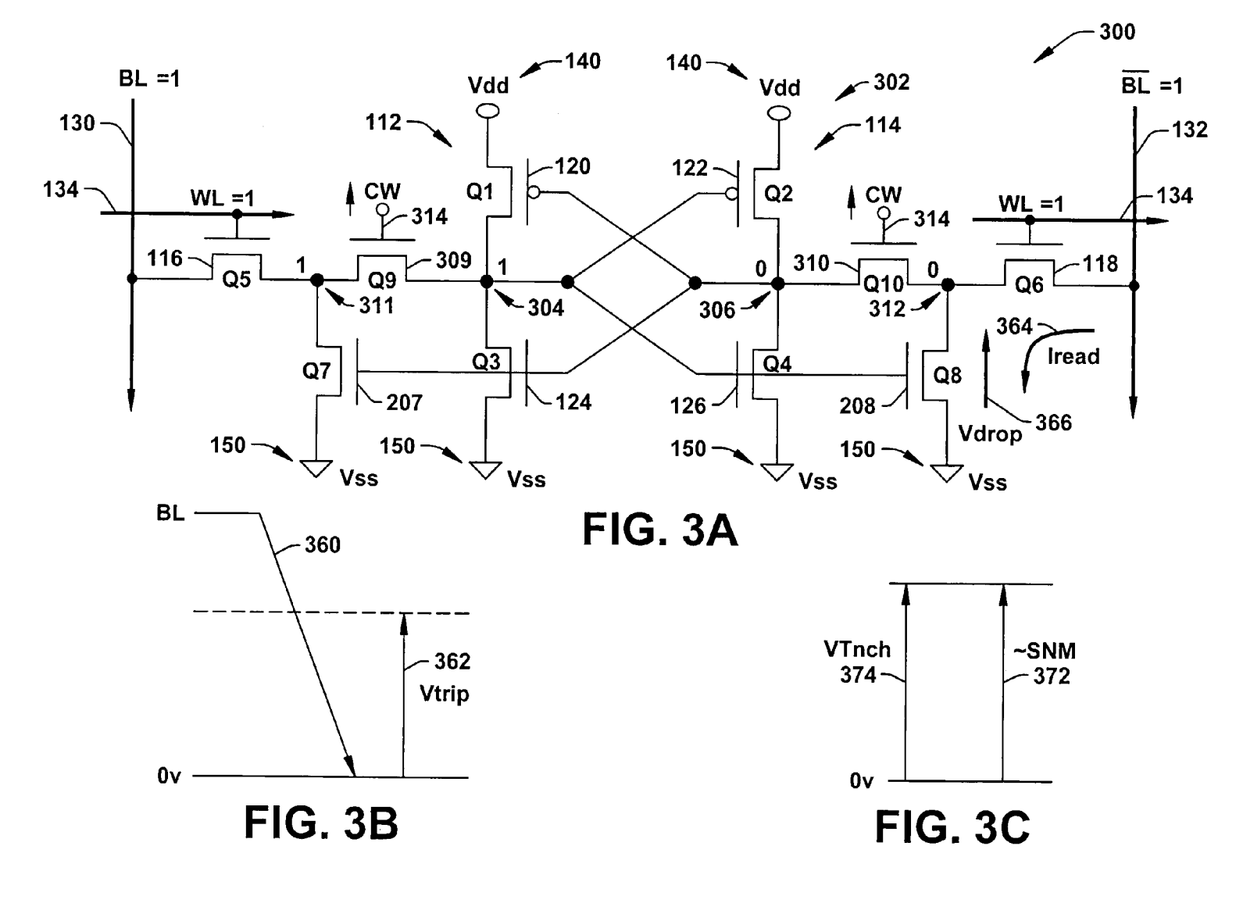
FIG. 3A is another schematic diagram of a 10 T SRAM cell, comprising the SRAM cell of FIG. 2A using the read driver to remove the read current from the data nodes during a read operation, and adding a column write pass transistor to select a column of cells during a write operation according to one or more aspects of the present invention.
FIG. 3B is a simplified plot of a bitline voltage, as applied to BL 130 being pulled below a trip voltage of the SRAM memory cell of FIG. 1A during a write operation.
FIG. 3C is a simplified diagram of the relative voltage relationship between the static noise margin and the threshold voltage of the SRAM memory cell of FIG. 3A during a read operation.

FIG. 3A illustrates an exemplary 10 T SRAM cell 300 according to one or more aspects of the present invention. Cell 300 comprises a further modification of the 8 T SRAM cell of FIG. 2A and therefore need not be completely described again for the sake of brevity. 10 T SRAM Cell 300 again comprises a latch 302 that uses the first and second read drivers Q7 207 and Q8 208 to remove the read current from first and second data nodes 304 and 306, respectively, during a read operation. Cell 300 further adds first and second column write (CW) pass transistors Q9 309 and Q10 310, respectively to select a column of cells during a write operation. These columns are selected during a write operation by coupling first and second latch nodes 304 and 306 to pass nodes 311 and 312 with column write pass transistors Q9 309 and Q10 310, respectively, while pass transistors Q5 116 and Q6 118 couple pass nodes 311 and 312 to BL 130 and BL-bar 132, respectively. Thereafter, the first and second bitlines, BL 130 and BL-bar 132, respectively, may be activated by selecting and precharging the bitlines (e.g., asserting a bitline selection signal or voltage) associated with cell 300, either before or during a read or write operation, such that the cell 300 is selected and activated.

During the write operation, wordline 134 is selected (e.g., by asserting a write signal or voltage to the wordline WL 134) and a column write signal is asserted to column write line 314 at the gates of column write pass transistors Q9 309 and Q10 310. In this way, the latch nodes 304 and 306 are conductively coupled to the bitlines BL 130 and BL-bar 132, respectively, during a write operation. For improved conduction to the latch 302, the write signals to write pass transistors Q9 309 and Q10 310, and/or wordline pass transistors Q5 116 and Q6 118 may be boosted above the Vdd supply voltage level, as will be discussed further in connection with FIGS. 5B-5D infra.

During a read operation, bitlines BL 130 and BL-bar 132 of cell 300, are again precharged to a high or "1" state, as shown in FIG. 3A. Wordline WL 134 is selected (e.g. by asserting a read signal or voltage to the wordline WL 134) to activate pass transistors Q5 116 and Q6 118 into conduction, and the column write line is deselected, turning off Q9 and Q10. For example, with the prior data states shown in FIG. 3A, an exemplary read current Iread 364 conducts from the bitline-bar 132 through wordline pass transistor Q6 118, pass node 312, and read driver Q8 208 to Vss 150.

Again, a read current Iread 364 through Q6 and Q8 briefly creates a voltage drop Vdrop 366 across Q8 208, until the charge on BL-bar 132 is discharged to Vss 150. However, with this configuration as with that of FIG. 2A, the read current Iread 364 beneficially bypasses pull-down transistors Q3 124 or Q4 126 and the latch nodes 304 or 306, respectively, thereby avoiding a voltage drop across Q3 124 or Q4 126 and a possible data upset therefrom. The voltage drop Vdrop 366 is still produced across Q8 208, however, the voltage at the pass node 312 is not coupled to the latch node 306 of the cell as in the conventional 6 T SRAM configuration. Thus, the 10 T cell of FIG. 3A illustrates that the read current Iread 364 is isolated from the latch nodes 304 and 306 of the cell of the present invention.

FIG. 3B illustrates a bitline voltage 360, as applied to BL 130 being pulled below the trip voltage Vtrip 362 of the SRAM memory cell 300 of FIG. 3A during a write operation, to change the state of the SRAM cell 300. Bitline voltage 360 further corresponds to the voltage that is on the high-side data stored in cell 300. In the present example, this would be the voltage at data node 304, during a write operation.

FIG. 3C illustrates the relative voltage relationship between the static noise margin SNM 372 and the threshold voltage VTnch of the pull-down n-channel transistors Q3 124 or Q4 126 of the SRAM memory cell 300 of FIG. 3A during a read operation. Again, as the read current Iread 364 bypasses the pull-down transistor Q4 126, there is no appreciable change in the static voltage drop across Q4 126, therefore the SNM 372 is not reduced by Vdrop 366 as in the conventional 6 T SRAM cell 100 of FIG. 1A, thereby stabilizing the data state of the cell 300 of FIG. 3A.

Figure 3D:
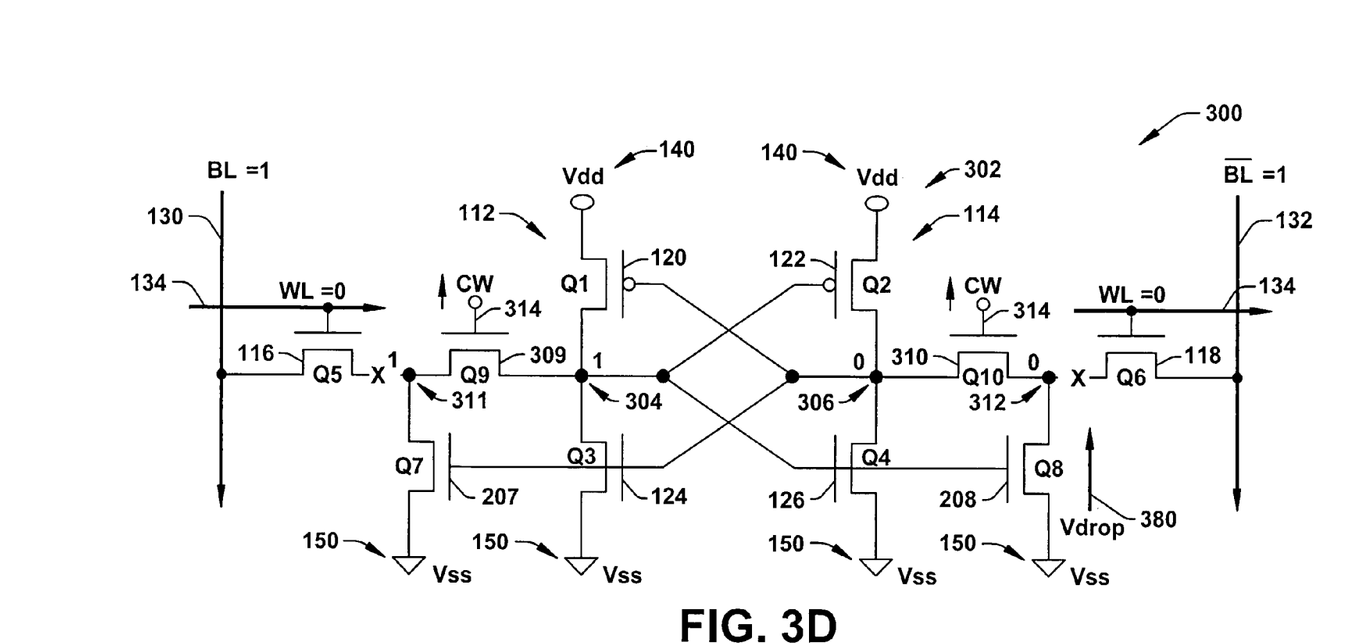
FIG. 3D is a schematic diagram of the 10 T SRAM cell of FIG. 3A as may be seen in an unselected wordline, wherein the wordline pass transistor is unselected, and wherein the column write pass transistor is selected during a write operation.

FIG. 3D illustrates another schematic diagram of the 10 T SRAM cell 300 of FIG. 3A (as may be seen from a function context) during a write operation in an unselected wordline of a selected column. During the write operation, the wordline pass transistors Q5 116 and Q6 118 are unselected, and therefore decouple pass nodes 311 and 312 from the bitlines BL 130 and BL-bar 132. Given the prior data states as shown in FIG. 3D, if the cell 300 is in a selected column, wherein the column write pass transistors Q9 309 and Q10 310 are selected and conduct (activated), then read driver Q8 208 and write pass transistor Q10 310 conduct and beneficially reinforce the present pull-down state of Q4 126. This conduction reinforces the low data state at latch node 306.

Further, with latch node 306 more firmly held low, then read driver Q7 207 is also firmly held off to reinforce (or, at least to not hinder) the high state at latch node 304. In addition, the latch 302 of cell 300 remains isolated from the charge on the bitlines 130,132, or the wordline 134, because wordline pass transistors Q5 116 and Q6 118 are unselected and therefore do not conduct.

Conversely, if the cell 300 of FIG. 3D is in an unselected column of an unselected wordline during a write operation, wherein the column write pass transistors Q9 309 and Q10 310 are not selected and non-conducting (deactivated), then read driver Q8 208 conducts, but write pass transistors Q9 309 and Q10 310 do not conduct. In addition, the data states at latch nodes 304 and 306 remain unaffected, while the latch 302 of cell 300 remains isolated from the charge on the bitlines 130, 132, or the wordline 134. Further, with latch node 306 more firmly held low, then read driver Q7 207 is also firmly held off to reinforce (or, at least to not hinder) the high state at latch node 304.

Figure 3E:
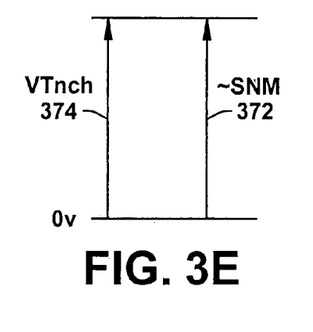
FIG. 3E is a simplified diagram of the relative voltage relationship between the static noise margin and the threshold voltage of the SRAM memory cell of FIG. 3A during a write operation.

FIG. 3E illustrates the relative voltage relationship between the static noise margin SNM 372 and the threshold voltage VTnch of the n-channel pull-down transistors Q3 124 or Q4 126 of the SRAM memory cell 300 of FIG. 3A during a write operation, involving bits with unselected wordlines. As no read current is present in the write operation, there is no appreciable change in the static voltage drop across Q4 126. Therefore the SNM 372 is not reduced by Vdrop 366 as in the conventional 6 T SRAM cell 100 of FIG. 1A, thereby stabilizing the data state of the cell 300 of FIG. 3D.

Figure 4:
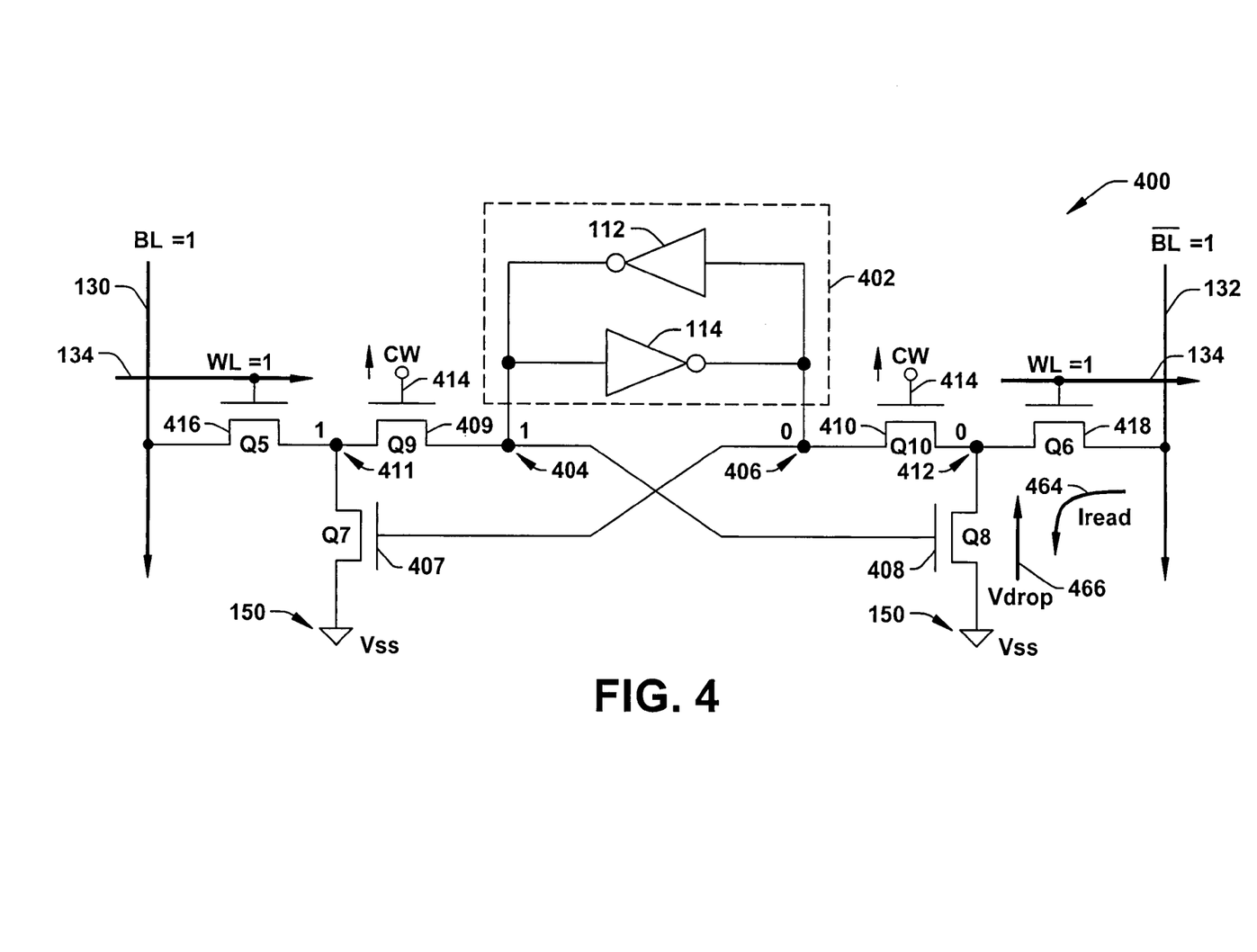
FIG. 4 is a schematic diagram of a conceptual 10 T SRAM cell similar to the SRAM cell of FIG. 3A using a read driver to remove the read current from the data nodes during a read operation, and a column write pass transistor to select a column of cells during a write operation according to one or more aspects of the present invention.

FIG. 4 illustrates another conceptual 10 T SRAM cell 400 with functions similar to those of the SRAM cell 300 of FIG. 3A according to one or more aspects of the present invention. Cell 400 comprises a latch 402 having first and second cross coupled inverters, the first inverter 112 having a first latch node 404 and the second inverter 114 having a second latch node 406. Cell 400 also includes a first write pass transistor Q9 409 connected between the first latch node 404 of the first inverter 112 and a first pass node 411, and a second write pass transistor Q10 410 connected between the second latch node 406 of the second inverter 114 and a second pass node 412.

Cell 400 further comprises a first wordline pass transistor Q5 416 connected between the first pass node 411 and a first bitline BL 130, and a second wordline pass transistor Q6 418 connected between the second pass node 412 and a second bitline BL-bar 132. The output of a first read driver 407 of cell 400 is connected to the first pass node 411, and a control terminal or input of the first read driver 407 is connected to the second latch node 406 of the second inverter 114. The output of a second read driver 408 of cell 400 is connected to the second pass node 412, and a control terminal or input of the second read driver 408 is connected to the first latch node 404 of the first inverter 112.

The first and second read drivers 407 and 408, respectively, are again used to remove the read current Iread 464 from the data nodes 404, 406 of latch 402 during a read operation, thereby eliminating the effects of any voltage drop Vdrop 466 at the output of the read drivers 407 and 408. In addition, the write pass transistors Q9 409 and Q10 412 are used to select a column of cells during a write operation. In this way, one or more columns may then be selected to minimize potential cell upsets and limit the power dissipation to the selected cells.

FIGS. 5A-5D illustrate graphs of trip voltage, read current, and static noise margin values of a conventional 6 T SRAM cell similar to that of cell 100 of FIG. 1A, contrasted to trip voltage, read current, and static noise margin values of a 10 T SRAM cell similar to that of FIGS. 3A and 4, the values plotted as a function of a change in boosted WL values in accordance with several aspects of the present invention.

Figure 5A:
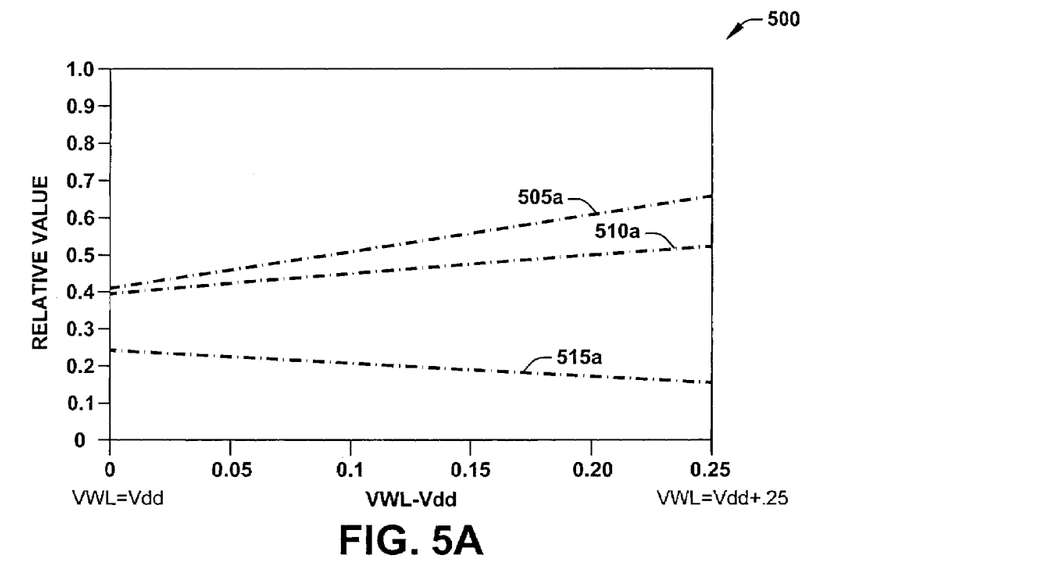
FIG. 5A is a plot of trip voltage, read current, and static noise margin values of a conventional 6 T SRAM cell similar to that of FIG. 1A, plotted as a function of a change in boosted WL values.
Figure 5B:
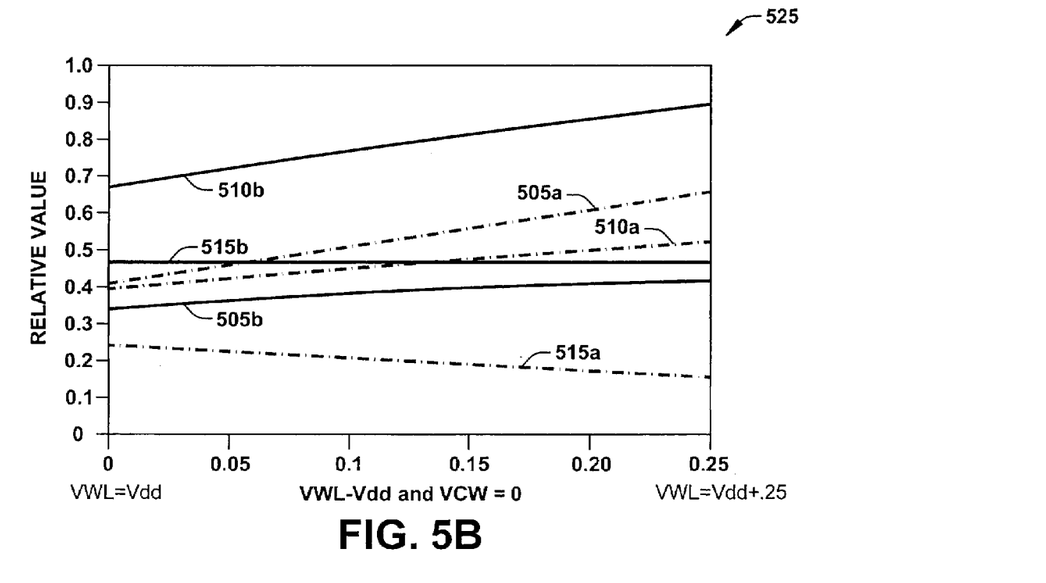
FIG. 5B is a plot comparing a trip voltage, read current, and static noise margin values of conventional 6 T SRAM cell similar to that of FIGS. 1A, to trip voltage, read current, and static noise margin values of a 10 T SRAM cell similar to that of FIGS. 3A and 4, the values plotted as a function of a change in boosted WL values in accordance with several aspects of the present invention.
Figure 5C:
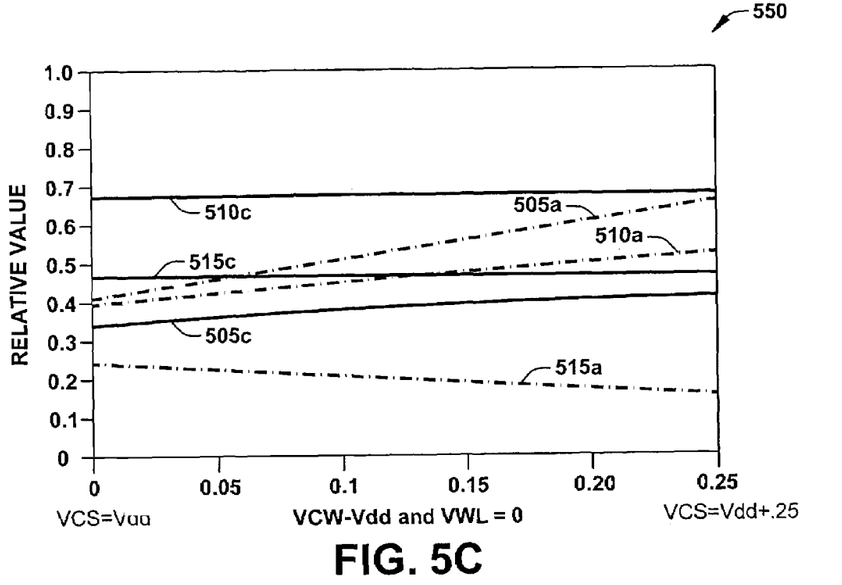
FIG. 5C is a plot comparing a trip voltage, read current, and static noise margin values of conventional 6 T SRAM cell similar to that of FIGS. 1A, to trip voltage, read current, and static noise margin values of a 10 T SRAM cell similar to that of FIGS. 3A and 4, the values plotted as a function of a change in boosted CW values in accordance with several aspects of the present invention.
Figure 5D:
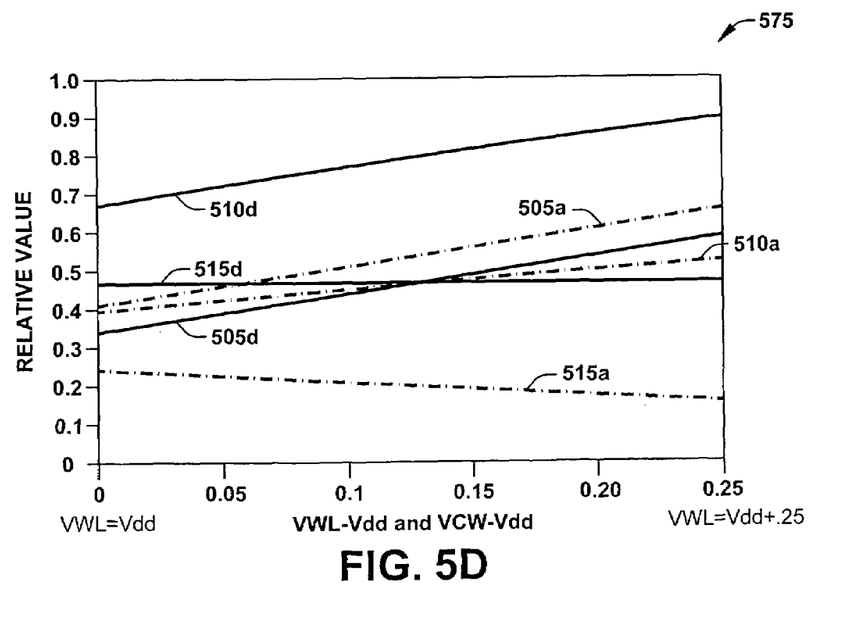
FIG. 5D is a plot comparing a trip voltage, read current, and static noise margin values of conventional 6 T SRAM cell similar to that of FIGS. 1A, to trip voltage, read current, and static noise margin values of a 10 T SRAM cell similar to that of FIGS. 3A and 4, the values plotted as a function of a change in boosted WL and CW values in accordance with several aspects of the present invention.

In FIGS. 5A, 5B, and 5D, the y-axis is in relative value units such as volts, or microamps, for example, while the x-axis is the change in wordline voltage VWL from the supply voltage Vdd, thereby labled (VWL−Vdd). In the example of these figures, the change in the VWL voltage corresponds to a boosted wordline voltage level over that of the Vdd voltage. Thus, when x=0 on the left side, VWL=Vdd, and when x=0.25 volts on the right side of the graph, VWL=Vdd+0.25 volts.

Similarly, in FIGS. 5C, the y-axis is in relative value units such as volts, or microamps, for example, while the x-axis is the change in column write voltage CW from the supply voltage Vdd, thereby labled (VCW−Vdd). In this example, the change in the VCW voltage corresponds to a boosted column write voltage level over that of the Vdd voltage. Thus, when x=0 on the left side, VCW=Vdd, and when x=0.25 volts on the right side of the graph, VCW=Vdd+0.25 volts.

FIG. 5A, for example, illustrates a graph 500 of trip voltage, read current, and static noise margin values of a conventional 6 T SRAM cell similar to that of cell 100 of FIG. 1A, the values plotted as a function of a change in boosted WL values in accordance with several aspects of the present invention.

Graph 500 of FIG. 5A illustrates that the trip voltage Vtrip 505a and a read current Iread 510a increase with an increasing wordline voltage VWL to the 6 T conventional SRAM cell, while a static noise margin SNM 515a decreases with an increasing wordline voltage VWL. Thus, in this example, the trip voltage Vtrip 505a and the read current Iread 510a generally improve with the more boosted wordline voltage VWL, while the SNM 515a worsens in the 6 T conventional SRAM cell.

FIG. 5B illustrates a graph 525 comparing the trip voltage Vtrip 505a, read current Iread 510a, and static noise margin values SNM 515a of the conventional 6 T SRAM cell of FIG. 5A, to trip voltage Vtrip 505b, read current Iread 510b, and static noise margin values SNM 515b of a 10 T SRAM cell similar to that of FIGS. 3A and 4 in accordance with several aspects of the present invention. Again, the values are plotted in graph 525 of FIG. 5B as a function of a change in boosted WL values, with CW deselected.

Graph 525 of FIG. 5B illustrates that, like the 6 T cell, the trip voltage Vtrip 505b and the read current Iread 510b increase in the 10 T SRAM cell of the present invention, with an increasing wordline voltage VWL. Although the Vtrip 505b of the 10 T cell increases less than that of the 6 T cell, the Iread current 510b of the 10 T cell is significantly improved over the Iread 505a of the 6 T cell. In addition, the static noise margin SNM 515b of the 10 T cell is significantly improved (e.g., nearly double) over the SNM 515a of the 6 T cell, and is nearly unchanged with an increasing wordline voltage VWL.

FIG. 5C illustrates a graph 550 comparing the trip voltage Vtrip 505a, read current Iread 510a, and static noise margin values SNM 515a of the conventional 6 T SRAM cell of FIG. 5A, to trip voltage Vtrip 505c, read current Iread 510c, and static noise margin values SNM 515c of a 10 T SRAM cell similar to that of FIGS. 3A and 4 in accordance with several aspects of the present invention. In FIG. 5C, the values are plotted as a function of a change in boosted CW values for 10 T cell, with WL deselected and contrasted to the boosted VWL values of the 6 T cell.

Graph 550 of FIG. 5C illustrates that, like the 6 T cell, the trip voltage Vtrip 505c increase in the 10 T SRAM cell of the present invention, while the read current Iread 510c stays nearly flat with an increasing column write voltage CW. Again, although the Vtrip 505c of the 10 T cell increases less than that of the 6 T cell, the Iread current 510c of the 10 T cell is significantly improved over the Iread 505a of the 6 T cell. In addition, the static noise margin SNM 515c of the 10 T cell is significantly improved (e.g., nearly double) over the SNM 515a of the 6 T cell, and is nearly unchanged with an increasing column write voltage CW.

FIG. 5D illustrates a graph 575 comparing the trip voltage Vtrip 505a, read current Iread 510a, and static noise margin values SNM 515a of the conventional 6 T SRAM cell of FIG. 5A, to trip voltage Vtrip 505d, read current Iread 510d, and static noise margin values SNM 515d of a 10 T SRAM cell similar to that of FIGS. 3A and 4 in accordance with several aspects of the present invention. The values in graph 575 of FIG. 5D, are plotted as a function of a change in boosted WL voltage and boosted CW voltage values.

Graph 575 of FIG. 5D illustrates that, like the 6 T cell, the trip voltage Vtrip 505d and the read current Iread 510d increase in the 10 T SRAM cell of the present invention, with an increasing wordline voltage VWL. Although the Vtrip 505d of the 10 T cell is offset about 0.08 volts lower than that of the 6 T cell it may be increased to a sufficient level by boosting the CW line. The Iread current 510d of the 10 T cell is significantly improved over the Iread 505a of the 6 T cell. In addition, the static noise margin SNM 515d of the 10 T cell is significantly improved (e.g., nearly double) over the SNM 515a of the 6 T cell, and is nearly unchanged with an increasing wordline voltage VWL and column write voltage VCW.

Although the 10 T SRAM cell 300 of FIG. 3A has been discussed in the context of a differential memory cell for access to differential bitlines, it is appreciated by the inventor that a single sided SRAM cell having access to a single bitline may also be utilized applying a similar read concept to isolate the read current from the latch nodes during a read operation, and/or a similar column write pass transistor concept for isolation during the read operation and for column selective access during a write operation. Further, other such cell and transistor technology variations, including array orientation variations are anticipated in the context of the present invention.

Figure 6:
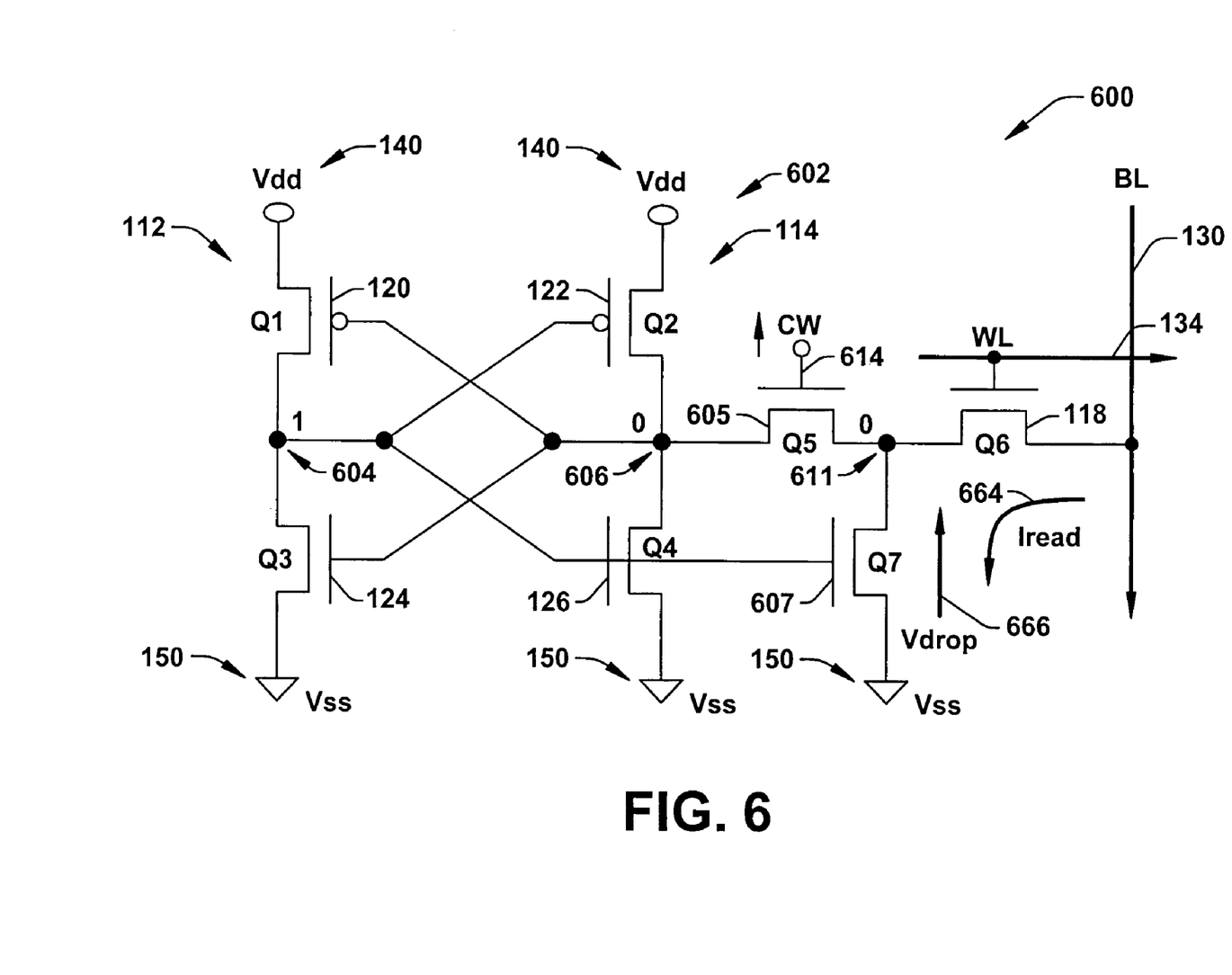
FIG. 6 is schematic diagram of a single sided 7 T SRAM cell, similar to the SRAM cell of FIG. 3A, comprising a read driver to remove the read current from a data node during a read operation, and a column write pass transistor to select a column of cells during a write operation according to one or more aspects of the present invention.

For example, FIG. 6 illustrates a single sided 7 T SRAM cell 600, functionally based on the SRAM cell of FIG. 3A in accordance with one or more aspects of the present invention. The single sided 7 T SRAM cell 600, comprises a read driver to remove the read current from a data node during a read operation, and a column write pass transistor to select a column of cells during a write operation. The 7 T SRAM cell 600, comprises a latch 602 having first and second cross-coupled inverters 112 and 114, having first and second latch nodes 604 and 606, respectively. Cell 500 further comprises a column write pass transistor Q5 605 connected to the second latch node 605 and a wordline pass transistor Q6 118 connected to a bitline BL 130, and a read driver Q7 607 connected to a pass node 611. Read driver Q7 607 is connected between pass node 611 and Vss 150, and has an input node connected to the first latch node 604.

As in the differential 10 T SRAM cell 300, single sided 7 T SRAM cell 600 uses the read driver 607 to isolate a read current Iread 664 from the latch 602, wherein a voltage drop Vdrop 666 formed across read driver 607 is isolated from second latch node 606 of latch 602 by column write pass transistor Q5 605 during a read operation. As with the differential cell 300 of FIG. 3A, the bitline BL 130 of cell 600 may be activated by selecting and precharging the bitline (e.g., asserting a bitline selection signal or voltage) associated with cell 600, either before or during a read or write operation, such that the cell 600 is selected and activated.

Figure 7:
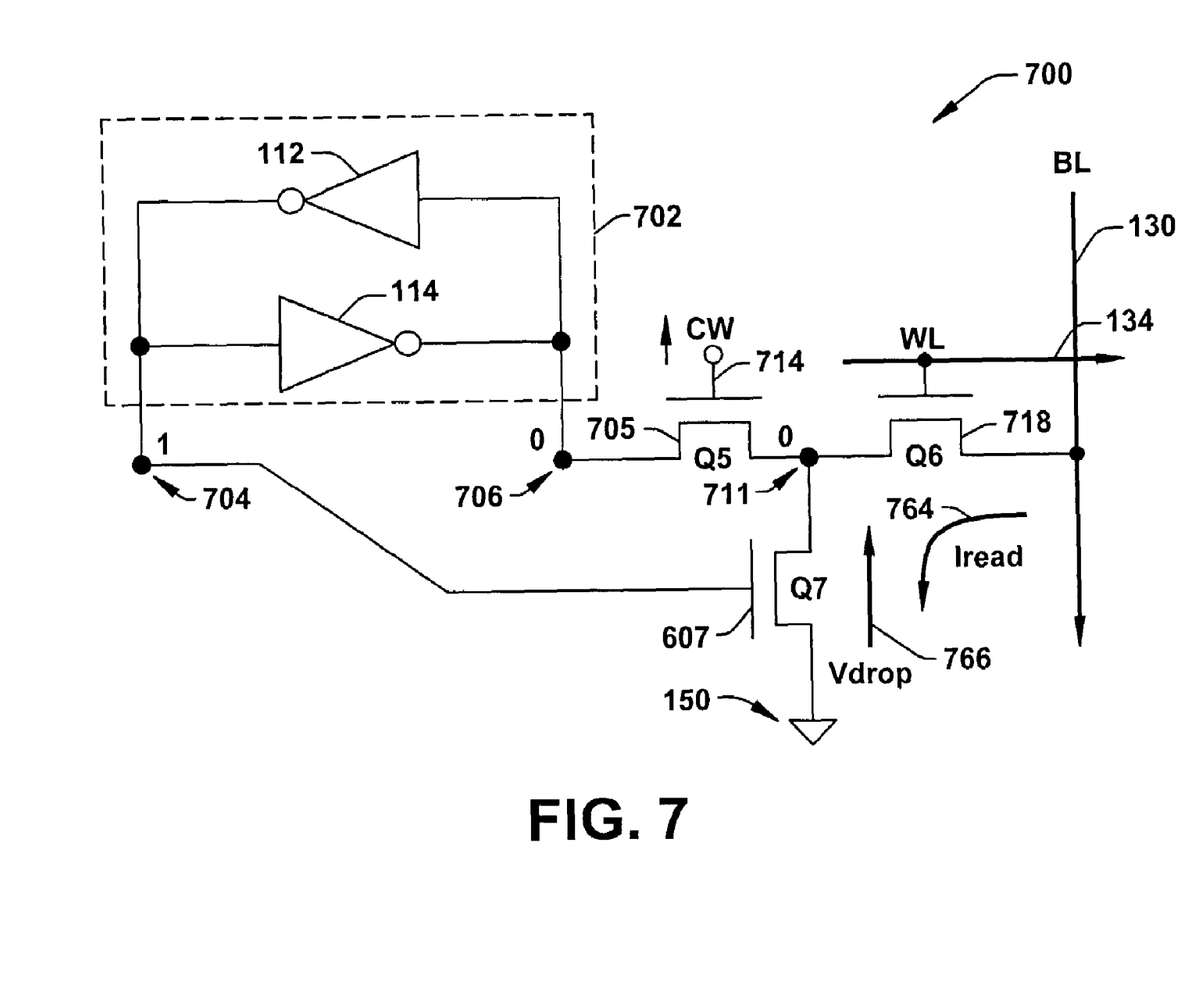
FIG. 7 is a schematic diagram of a conceptual single sided SRAM cell similar to the SRAM cell of FIG. 6, comprising a read driver to remove the read current from a data node during a read operation, and a column write pass transistor to select a column of cells during a write operation according to one or more aspects of the present invention.

FIG. 7 illustrates a conceptual single sided SRAM cell 700, functionally similar to single-sided 7 T SRAM cell of FIG. 6 and the differential 10 T SRAM cell 300 of FIG. 3A in accordance with one or more aspects of the present invention. The single sided SRAM cell 600, comprises a read driver to remove the read current from a data node during a read operation, and a column write pass transistor to select a column of cells during a write operation.

Cell 700 comprises a latch 702 having first and second cross coupled inverters, the first inverter 112 having a first latch node 704 and the second inverter 114 having a second latch node 706. Cell 700 also includes a write pass transistor Q5 705 connected between the second latch node 706 of the second inverter 114 and a pass node 711.

Cell 700 further comprises a wordline pass transistor Q6 718 connected between the pass node 711 and a bitline BL 130. The output of a read driver 707 of cell 700 is connected to the pass node 711, and a control terminal or input of the read driver 707 is connected to the first latch node 704 of the first inverter 112.

The read driver 707 is again used to remove the read current Iread 764 from the latch node (data node) 706 of latch 702 during a read operation, thereby eliminating the effects of any voltage drop Vdrop 766 at the output of the read driver 707. In addition, the write pass transistor Q5 705 is used to select a column of cells during a write operation. In this way, one or more columns may then be selected to minimize potential cell upsets and limit the power dissipation to the selected cells.

A method of operating (e.g., reading or writing) the data state of an SRAM cell is also disclosed, utilizing the SRAM cell (e.g., single-ended or differential SRAM cell) of the present invention as described above. In one implementation, the method comprises activating the wordline pass transistor(s) by asserting a wordline signal WL associated with a plurality of cells of a row of the array for a read operation. The method also includes deactivating the write pass transistor(s) by deasserting a column write signal CW associated with a plurality of cells of a column of the array for a read operation. The method further comprises activating the bitline(s) by asserting a bitline selection signal associated with one of the plurality of cells of a column of the array for the read operation such that the one of the plurality of cells of the array is activated, wherein a read current conducts through the respective read driver(s).

In addition, the method further includes, activating the write pass transistor(s) by asserting a column write signal associated with a plurality of cells of a column of the array during the write operation such that one of the plurality of cells of the array is activated.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, wherein cell size and patterning considerations are problematic, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. An SRAM cell, comprising:
   first and second cross-coupled inverters, the first inverter having a first latch node and the second inverter having a second latch node;
   a first write pass transistor connected between the first latch node of the first inverter and a first pass node;
   a first wordline pass transistor connected between the first pass node and a first bitline;
   a first read driver connected between the first pass node and a source potential, and a control terminal of the first read driver connected to the second latch node of the second inverter.

2. The SRAM cell of claim 1, wherein the first inverter comprises a first pull-up transistor and a first pull-down transistor and the second inverter includes a second pull-up transistor and a second pull-down transistor.

3. The SRAM cell of claim 1, wherein the first inverter comprises a p-channel first pull-up transistor and an n-channel first pull-down transistor and the second inverter comprises a p-channel second pull-up transistor and an n-channel second pull-down transistor.

4. The SRAM cell of claim 1, wherein the first write pass transistor, first wordline pass transistor, and first read driver are n-channel devices.

5. The SRAM cell of claim 1, wherein the first wordline pass transistor has a width that is about equal to or greater than the width of the read driver.

6. The SRAM cell of claim 1, wherein the write pass transistor has a width that is about equal to or greater than the width of the read driver.

7. The SRAM cell of claim 1, wherein the cell is used for low voltage or low power applications having a supply voltage level of about Vt+0.2 volts or greater to about 4 * Vt or less, wherein Vt is the threshold voltage of a transistor of the first and second inverters.

8. The SRAM cell of claim 1, wherein the cell is used for low voltage or low power applications having a supply voltage level of about Vt+0.2 volts or greater to about 4 * Vt or less, wherein Vt is the threshold voltage of a transistor used in the cell and is about 0.4 volts or less.

9. The SRAM cell of claim 1, wherein the first read driver comprises one of a transistor, an n-channel device, a p-channel device, an inverter, and a control circuit.

10. The SRAM cell of claim 1, wherein the first write pass transistor, the first wordline pass transistor, and the first read driver are about the same size transistor devices.

11. The SRAM cell of claim 1, further comprising:
    a second write pass transistor connected between the second latch node of the second inverter and a second pass node;
    a second wordline pass transistor connected between the second pass node and a second bitline; and a second read driver connected between the second pass node and the source potential, and a control terminal of the second read driver connected to the first latch node of the first inverter.

12. The SRAM cell of claim 11, wherein the first and second read drivers comprise one of a transistor, an n-channel device, a p-channel device, an inverter, and a control circuit.

13. A method of operating an SRAM memory cell of an array, the cell comprising first and second cross-coupled inverters, the first inverter having a first latch node and the second inverter having a second latch node; a first write pass transistor connected between the first latch node of the first inverter and a first pass node; a first wordline pass transistor connected between the first pass node and a first bitline; a first read driver connected between the first pass node and a source potential, and a control terminal of the first read driver connected to the second latch node of the second inverter, the method comprising:
  activating the first wordline pass transistor by asserting a wordline signal associated with a plurality of cells of a row of the array during a read or a write operation;
  activating the first write pass transistor by asserting a column write signal associated with a plurality of cells of a column of the array during the write operation such that one of the plurality of cells of the array is activated;
  deactivating the first write pass transistor by deasserting a column write signal associated with a plurality of cells of a column of the array during the read operation; and
  activating the first bitline by selecting and precharging the bitline associated with one of the plurality of cells of a column of the array during the read operation such that the one of the plurality of cells of the array is activated, wherein a read current conducts through the first read driver.

14. The method of claim 13, wherein the wordline signal asserted to the first wordline pass transistor is boosted above the supply voltage.

15. The method of claim 13, wherein the column write signal asserted to the first write pass transistor is boosted above the supply voltage.

16. The method of claim 13, further comprising
  activating the first bitline by selecting and precharging the bitline associated with one of the plurality of cells of a column of the array during the write operation such that the one of the plurality of cells of the array is activated.

17. A method of operating an SRAM memory cell of an array, the cell comprising first and second cross-coupled inverters, the first inverter having a first latch node and the second inverter having a second latch node; a first write pass transistor connected between the first latch node of the first inverter and a first pass node; a first wordline pass transistor connected between the first pass node and a first bitline; a first read driver connected between the first pass node and a source potential, and a control terminal of the first read driver connected to the second latch node of the second inverter; a second write pass transistor connected between the second latch node of the second inverter and a second pass node; a second wordline pass transistor connected between the second pass node and a second bitline; and a second read driver connected between the second pass node and the source potential, and a control terminal of the second read driver connected to the first latch node of the first inverter, the method comprising:
  activating the first and second wordline pass transistors by asserting a wordline signal associated with a plurality of cells of a row of the array during a read or a write operation;
  activating the first and second write pass transistors by asserting a column write signal associated with a plurality of cells of a column of the array during the write operation such that one of the plurality of cells of the array is activated;
  deactivating the first and second write pass transistors by deasserting a column write signal associated with a plurality of cells of a column of the array during the read operation; and
  activating the first and second bitlines by selecting and precharging the bitline associated with one of the plurality of cells of a column of the array during the read operation such that the one of the plurality of cells of the array is activated, wherein a read current conducts through one or more of the first and second read drivers.

18. The method of claim 17, wherein the wordline signal asserted to the first and second wordline pass transistors is boosted above the supply voltage.

19. The method of claim 17, wherein the column write signal asserted to the first and second write pass transistors is boosted above the supply voltage.

20. The method of claim 17, further comprising
  activating the first and second bitlines by selecting and precharging the bitline associated with one of the plurality of cells of a column of the array during the write operation such that the one of the plurality of cells of the array is activated.

* * * * *